United States Patent

Wright et al.

[11] Patent Number: 6,097,781
[45] Date of Patent: Aug. 1, 2000

[54] SHARED COUNTER

[75] Inventors: Jeffrey P. Wright; Hua Zheng, both of Boise, Id.

[73] Assignee: Micron Technology, Inc., Boise, Id.

[21] Appl. No.: 09/017,370

[22] Filed: Feb. 2, 1998

Related U.S. Application Data

[63] Continuation of application No. 08/593,493, Jan. 30, 1996.

[51] Int. Cl.[7] ............................................. G06M 3/00
[52] U.S. Cl. ............................ 377/26; 377/33; 377/55; 377/56
[58] Field of Search ............................. 377/26, 33, 55, 377/56; 365/236

[56] References Cited

U.S. PATENT DOCUMENTS

| | | | |
|---|---|---|---|
| 4,394,753 | 7/1983 | Penzel | 365/236 |
| 4,745,630 | 5/1988 | Underwood | 377/29 |
| 4,942,576 | 7/1990 | Busack et al. | 371/21.2 |
| 4,975,884 | 12/1990 | Waller | 365/230.06 |
| 5,262,998 | 11/1993 | Mnich et al. | 365/222 |
| 5,325,502 | 6/1994 | McLaury | 395/425 |
| 5,455,801 | 10/1995 | Blodgett et al. | 365/222 |
| 5,481,581 | 1/1996 | Jonas, Jr. | 377/33 |
| 5,594,765 | 1/1997 | Oh | 377/44 |
| 5,808,958 | 9/1998 | Vogley et al. | 365/233 |

FOREIGN PATENT DOCUMENTS

| | | |
|---|---|---|
| 0662691 | 7/1995 | European Pat. Off. . |
| 59-223028 | 12/1984 | Japan . |
| 60-048633 | 3/1985 | Japan . |

OTHER PUBLICATIONS

Horowitz, P., et al., "The Art of Electronics", *Cambridge University Press, 1980*, 335–336.

*Primary Examiner*—Margaret R. Wambach
*Attorney, Agent, or Firm*—Schwegman, Lundberg, Woessner & Kluth, P.A.

[57] ABSTRACT

A shared counter performs multiple counting functions in an electronic circuit, such as a memory integrated circuit. An input selection circuit selects one of M input data sets at a given time to be provided as counter initialization data. A counter circuit provides counter output data based on the counter initialization data. An output circuit provides the counter output data to K destination circuits in the electronic circuit. The output circuit provides only one of the K destination circuits with the counter output data at a given time.

23 Claims, 2 Drawing Sheets

SHARED COUNTER

This application is a continuation of Ser. No. 08/593,493 still pending filed Jan. 30, 1996.

THE FIELD OF THE INVENTION

The present invention relates to semiconductor integrated circuits and, more particularly to counters for performing counting functions in semiconductor integrated circuits such as memory integrated circuits.

BACKGROUND OF THE INVENTION

Counters are utilized throughout integrated circuit designs to perform various counting functions. One type of integrated circuit device which uses counters is integrated memory circuits, such as dynamic random access memories (DRAMs), static random access memories (SRAMs), video random access memories (VRAMs), synchronous dynamic random access memories (SDRAMs), and synchronous graphic random access memories (SGRAMs). For example, SDRAMs and SGRAMs comprise multiple counters to perform various counting functions such as a burst counting function, a self-refresh counting function, and an auto refresh counting function.

As is known in the art of integrated circuit design, counters are typically implemented with a relatively large number of logic gates in the integrated circuit. The cells occupied by the counter logic gates can represent a significant portion of available die real estate of the integrated circuit. This is especially true in semi-conductor memory integrated circuits, where there is an ever present need to achieve higher memory cell population capacities in smaller die areas. Typical integrated memory circuits comprise millions of equivalent memory cells arranged in arrays of addressable rows and columns, along with support logic circuitry of which a significant portion represents circuitry to perform the required counting functions of the memory integrated circuit. Therefore, there is a need in integrated circuits and especially in semi-conductor memory integrated circuits to achieve the necessary counting functions with minimal logic gates.

SUMMARY OF THE INVENTION

The present invention provides a shared counter for performing multiple counting functions in an electronic circuit. The share counter includes an input selection circuit selecting one of M input data sets at a given time to be provided as counter initialization data. A counter circuit provides counter output data based on the counter initialization data. An output circuit provides the counter output data to K destination circuits in the electronic circuit. The output circuit provides only one of the K destination circuits with the counter output data at a given time.

One embodiment of the shared counter according to the present invention includes a first buffer receiving the counter output data from the counter circuit and storing first buffer data corresponding to a first counting function. In this embodiment, a multiplexer circuit receives control information and a plurality of counter data sets including the counter initialization data and the first buffer data. The multiplexer circuit provides a selected one of the plurality of counter data sets as counter input data to the counter circuit. The selected one of the plurality of counter data sets is selected based on the control information. The counter output data is a function of the counter input data.

One embodiment of the shared counter according to the present invention is employed in an integrated electronic circuit, such as a memory integrated circuit, requiring multiple counting functions which are not performed simultaneously. For example, one such embodiment of the shared counter according to the present invention is implemented in a synchronous dynamic random access memory or a synchronous graphic random access memory, which requires at least a self-refresh timing counting function, an auto-refresh counting function, and a burst counting function. The shared counter can, however, be implemented in any electronic circuit requiring two or more counting functions which are not performed at the same time.

The shared counter according to the present invention is especially useful in semiconductor memory integrated circuits because of the desire to achieve higher memory cell population capacities in smaller die areas. The shared counter according to the present invention reduces the number of cells occupied by the support logic circuitry, of which a significant portion represents circuitry to perform the required counting functions of the memory integrated circuit. The logic gates saved from eliminating a portion of the support logic circuitry by sharing the counter functions in one shared counter, can be used to provide a significant increase in the amount of memory storage cells of the memory integrated circuit or to reduce the power consumed by the memory integrated circuit.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
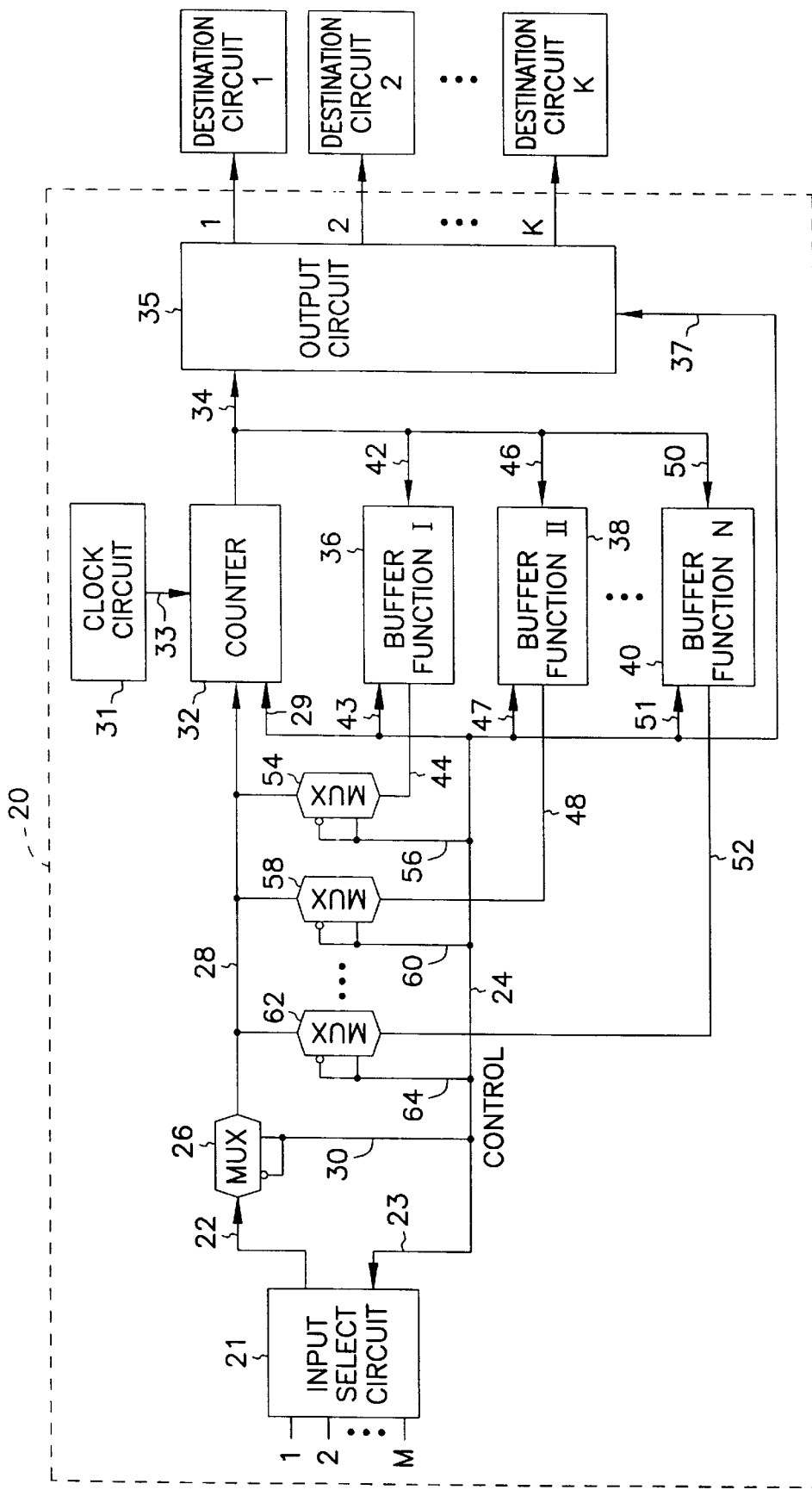
FIG. 1 is a schematic and logic block diagram of a shared counter according to the present invention.

A shared counter, according to the present invention is illustrated generally at 20 in FIG. 1. Shared counter 20 includes an input select circuit 21 which receives up to M input data sets on input lines 1 through M. Shared counter 20 is controlled by control information received on a control line 24. Input select circuit 21 provides one of the input data sets received on input lines 1 through M as initialization data on an input line 22 based on control information provided from control line 24 via a line 23. The initialization data on line 22 is provided to a multiplexer 26. If properly selected, multiplexer 26 provides the initialization data as counter input data on a line 28. A control bit from control line 24 is provided to select inputs of multiplexer 26 via a line 30 to control when multiplexer 26 is selected to provide the initialization data from line 22 to line 28 as counter input data.

A counter circuit 32 receives the counter input data from line 28 and counts up or down in a known manner to provide counter output data on a line 34. A clock circuit 31 provides a clock signal to counter circuit 32 on a line 33 to clock each count of counter circuit 32. Clock circuit 31 represents any suitable circuit or circuits capable of generating the required clock signal to counter 32 such as an internal clock generator circuit, an internal oscillator, receiving circuitry for receiving an external clock, and a multiplexer for providing a variety of clock signals with a variety of frequencies to counter 32. Counter circuit 32 is controlled by a control signal provided from control line 24 via a line 29.

The counter output data on line 34 is provided to an output circuit 35. Output circuit 35 selects one of output lines 1 through K at a given time based on control information provided from control line 24 via a line 27. Output circuit 35 provides the counter output data on the selected output line. In the embodiment illustrated, the 1 through K output lines are coupled to K destination circuits 1 through K. Thus, shared counter 20 provides counter output data for up to K destination circuits as long as the destination circuits require the data at separate times. Nevertheless, one line can possibly feed more than one destination circuit. Thus, there can be from 1 to K lines to feed K destination circuits.

The counter output data on line 34 is also provided to N buffers corresponding to N separate functions. As illustrated in FIG. 1, function I corresponds to buffer 36, function II corresponds to buffer 38, and function N corresponds to buffer 40. Buffer 36 receives the counter output data from counter circuit 32 on line 34 via a line 42 and stores the counter output data if properly enabled by a control signal from control line 24 via a line 43. Buffer 36 provides buffer I data on a line 44. Similarly, buffer 38 receives the counter output data from counter circuit 32 on line 34 via a line 46 and stores the counter output data if properly enabled by a control signal from control line 24 via a line 47. Buffer 38 provides buffer II data on a line 48. Buffer 40 receives the counter output data from counter circuit 32 on line 34 via a line 50 and stores the counter output data if properly enabled by a control signal from control line 24 via a line 51. Buffer 40 provides buffer N data on a line 52.

A multiplexer 54 receives the buffer I data on line 44 from buffer 36. If selected, multiplexer 54 provides the buffer I data as counter input data on line 28 to counter circuit 32. A control bit from control line 24 is provided to select inputs of multiplexer 54 via a line 56 to control when multiplexer 54 is selected to provide the buffer I data from line 44 to line 28 as counter input data. A multiplexer 58 receives the buffer II data on line 48 from buffer 38. If selected, multiplexer 58 provides the buffer II data as counter input data on line 28 to counter circuit 32. A control bit from control line 24 is provided to select inputs of multiplexer 58 via a line 60 to control when multiplexer 58 is selected to provide the buffer II data from line 48 to line 28 as counter input data. A multiplexer 62 receives the buffer N data on line 52 from buffer 40. If selected, multiplexer 62 provides the buffer N data as counter input data on a line 28 to counter circuit 32. A control bit from control line 24 is provided to select inputs of multiplexer 62 via a line 64 to control when multiplexer 62 is selected to provide the buffer N data from line 52 to line 28 as counter input data.

In operation, N+1 control bits in the control information on control line 24 control which of a plurality of counter data sets including the initialization data on line 22, the buffer I data on line 44, the buffer II data on line 48, . . . , and the buffer N data on line 52 are placed on line 28 to be provided to counter 32 as counter input data. In other words, only one of the input multiplexers including multiplexer 26 and the N multiplexers corresponding to the N buffers such as multiplexers 54, 58, and 62 is selected to pass data to line 28 at any one time.

When input select circuit 21 first provides initialization data on line 22 from one of the 1 through M input lines to multiplexer 26, the control bit provided on line 30 selects multiplexer 26 to pass the initialization data through to line 28 to be input into counter circuit 32. After being operated on by counter circuit 32, counter output data is placed in an appropriate function buffer if the counter output data needs to be stored or held until after a different counting function is performed by counter 32. Data previously stored in one of the function buffers is selected if that data needs to be read out of the counter or needs to be counted up or counted down in a known manner. The appropriate counting function is selected through the control bits contained in the control information on control line 24.

For example, data from line 22 corresponding to the counting function I is first input through multiplexer 26 to line 28 to counter circuit 32, then output on line 34, and then stored in buffer 36 when properly enabled by the control signal on line 43. When buffer I data needs to be counted up or down, multiplexer 54 is selected to provide the buffer I data from buffer 36 to line 28 to be counted up or down by counter circuit 32. The updated data from counter circuit 32 is then provided on line 34 to line 42 to be input back into buffer 36. Alternatively, buffer I data from buffer 36 is provided as output data on line 34 without counter 32 counting up by selecting multiplexer 54 to provide the buffer I data to line 28 to counter circuit 32, which is prevented from counting up or down based on the control signal on line 29 to permit the buffer I data to be provided on line 34 as counter output data to output circuit 35 to be used by one of the 1 through K destination circuits in the integrated or other electronic circuit which employs shared counter 20.

Thus, shared counter 20 accommodates up to M input data sets to provide counter output data to up to K destination circuits. In addition, up to N separate output data sets associated with N separate counter functions can be stored in the function buffers while other counting functions are performed by counter circuit 32. Because of the shared nature of shared counter 20, none of the counter functions can be performed simultaneously in the integrated or other electronic circuit, which comprises shared counter 20. In other words, shared counter 20 receives only one of the M input data sets at a given time, provides counter output data to only one of the K destination circuits at a given time, and operates on and stores only one of N function buffer data sets at a given time. Nevertheless, when performing one counting function, counter output data corresponding to other counting functions previously performed by shared counter 20 is held for later retrieval in corresponding function buffers if necessary.

The shared counter 20 illustrated in FIG. 1 can be utilized in any suitable integrated or other electronic circuit requiring more than one counter function, where the counter functions do not need to be performed simultaneously. Shared counter 20 is, however, especially useful in semiconductor memory integrated circuits because of the desire to achieve higher memory cell population capacities in smaller die areas. The logic gates saved from eliminating counter circuitry by sharing the counter functions in one shared counter 20, can be used to provide a significant increase in the amount of memory storage cells of the memory device or to reduce the power consumed by the memory device.

Figure 2:
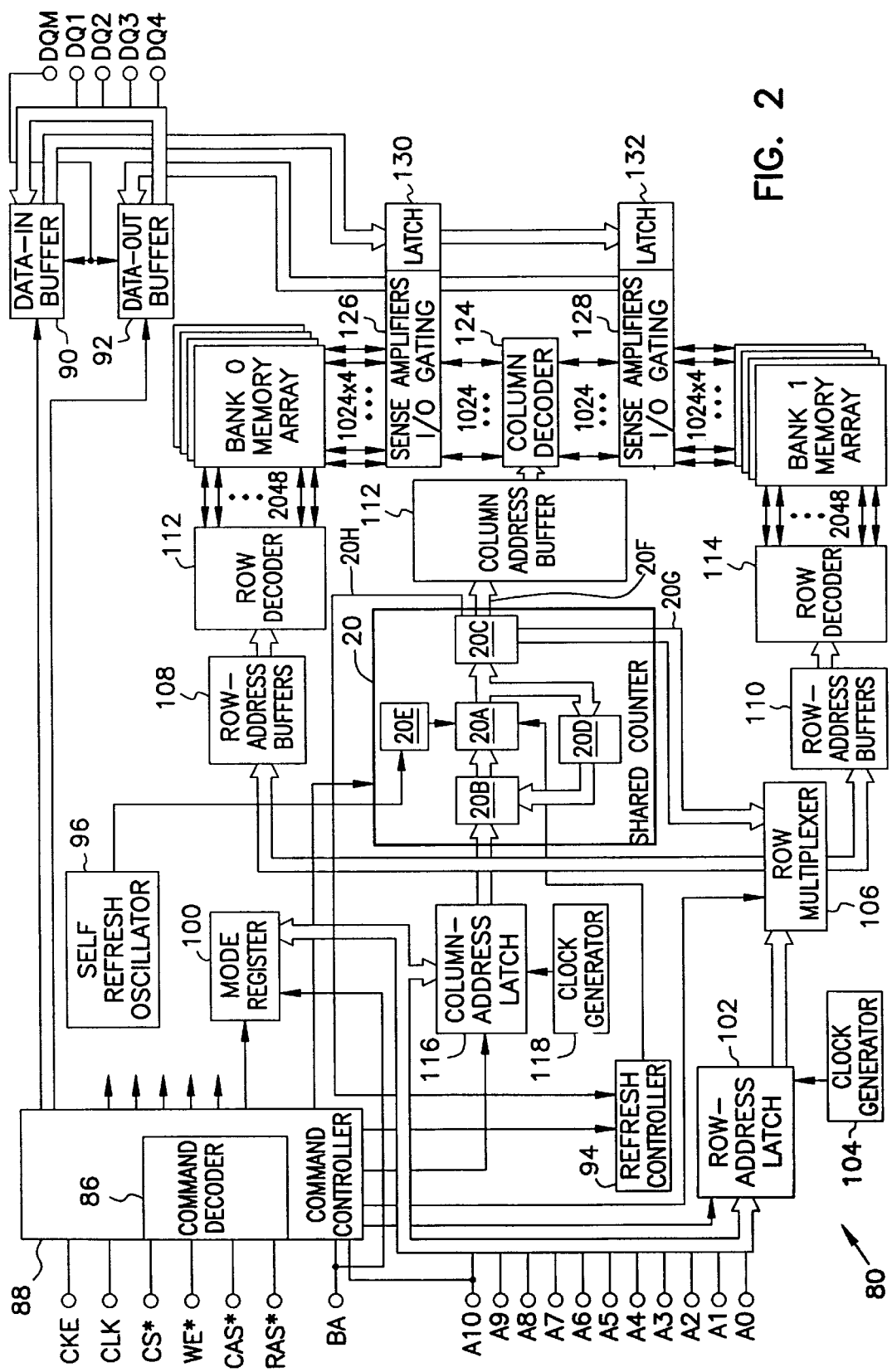
FIG. 2 is a block diagram of a SDRAM which uses a shared counter according to the present invention.

A synchronous dynamic random access memory (SDRAM), which comprises a shared counter 20 is illustrated generally at 80 in FIG. 2 in block diagram form. Much of the circuitry of SDRAM 80 is similar to circuitry in known SDRAMs, such as the Micron Technology, Inc.

MT48LC4M4R1 S 4 MEG×4 SDRAM, which is described in detail in the corresponding Micron Technology, Inc. Functional Specification, which is incorporated herein by reference. Another embodiment of shared counter 20, is included in a synchronous graphics random access memory (SGRAM), which requires similar counting functions as a SDRAM and is therefore not illustrated in the drawings. SGRAMs differ from SDRAMs by providing certain column block write functions and masked write or write-per-bit functions to accommodate high-performance graphics applications. Much of the circuitry of the SGRAM according to the present invention is similar to circuitry in known SGRAMs, such as the Micron Technology, Inc. MT41LC256K32D4(S) 256K×32 SGRAM, which is described in detail in the corresponding Micron Technology, Inc. 1995 DRAM Data Book, which is incorporated herein by reference.

The following described embodiment of shared counter 20 is implemented in SDRAM 80. The present invention is, however, not limited to SDRAMs or SGRAMs, as the present invention is equally applied to other memory devices such as dynamic random access memories (DRAMs), static random access memories (SRAMs). and video random access memories (VRAMs) that require multiple counting functions which are not performed simultaneously. In fact, the shared counter according to the present invention, such as shared counter 20, can be implemented in any integrated or other electronic circuit requiring multiple counting functions which are not performed simultaneously.

SDRAM 80 includes a bank 0 memory array and of bank 1 memory array which both comprise storage cells organized in rows and columns for storing data. In one embodiment of SDRAM 80, each bank memory array comprises four separate arrays of 2048 rows×1024 columns.

As is illustrated in FIG. 2, power is supplied to SDRAM 80 pins Vcc and Vss. A typical SDRAM 80 provides optimum memory performance in a low voltage environment such as a 3.3 V environment. A system clock (CLK) signal is provided through a CLK input pin and a clock enable signal (CKE) is provided through a CKE input pin to SDRAM 80. The CLK signal is activated and deactivated based on the state of the CKE signal. All the input and output signals of SDRAM 80, with the exception of the CKE input signal during power down and self refresh modes, are synchronized to the active going edge (the positive going edge in the embodiment illustrated in FIG. 2) of the CLK signal.

A chip select (CS*) input pin inputs a CS* signal which enables, when low, and disables, when high a command decoder 86. Command decoder 86 is included in a command controller 88. Command decoder 86 receives control signals including a row address strobe (RAS*) signal on a RAS* pin, column address strobe (CAS*) signal on a CAS* pin, and a write enable (WE*) signal on a WE* pin. Command decoder 86 decodes the RAS*, CAS*, and WE* signals to place command controller 88 in a particular command operation sequence. Command controller 88 controls the various circuitry of SDRAM 80. including shared counter 20 based on decoded commands such as during controlled reads or writes from or to bank 0 memory array and bank 1 memory array. A bank address (BA) signal is provided on a BA input pin to define which bank memory array should be operated on by certain commands issued by command controller 88.

Address inputs bits are provided on input pins A0–A10. Both the row and column address input bits are provided on the address input pins. During write transfer operations, data is supplied to SDRAM 80 via input/output pins (DQ1–DQ-4). During read transfer operations, data is clocked out of SDRAM 80 via input/output pins DQ1–DQ-4. An input/output mask signal is provided on a DQM input pin to provide non-persistent buffer control for a data-in-buffer 90 and a data-out buffer 92.

SDRAM 80 must be powered-up and initialized in a predefined manner. In addition, both bank 0 and bank 1 memory arrays must be precharged and placed in an idle state. The precharging of the bank memory arrays is preformed with a PRECHARGE command operation. Once in the idle state, two AUTO-REFRESH command operations must be performed. Once the two AUTO-REFRESH operations are performed SDRAM 80 is available for programming of a mode register 100. Mode register 100 is assumed to have an unknown state when SDRAM 80 is powered up. Consequently, before performing any operational command, mode register 100 must be set or programmed.

Mode register 100 is typically a persistent register wherein once programmed, the mode register retains the program op-code until the mode register is reprogrammed or SDRAM 80 loses power. Most of the possible programmable options of SDRAM 80 are defined in the op-codes stored in mode register 80. Typically mode register 80 is programmed by providing a desired op-code via the BA input pins and the A0–A10 address inputs, in conjunction with a SET MODE REGISTER command determined by CS*, RAS*, CAS*, and WE* being registered low.

A valid ACTIVE command is initiated by command controller 28 with the CS* and RAS* signals low with the CAS* and WE* signals high on a rising edge of the CLK signal. During the ACTIVE command the state of the BA signal determines which bank memory array to activate and address. During the ACTIVE command a value representing a row address of the selected bank memory array, as indicated by address bits on input pins A0–A10, is latched in a row address latch 102 in response to a clock signal generated from a clock generator circuit 104. The latched row address is provided to a row multiplexer 106 which provides a row address to row address buffers 108 to be provided to bank 0 memory array or row address buffers 110 to be provided to bank 1 memory array depending on the state of the BA signal. A row decoder 112 decodes the row address provided from row address buffers 108 to activate one of the 2,048 lines corresponding to the row address for read or write transfer operations, to thereby activate the corresponding row of storage cells in bank 0 memory array. Row decoder 114 similarly decodes the row address in row address buffer 110 to activate one of the 2,048 lines to bank 1 memory array corresponding to the row address for read or write transfer operations, to thereby activate the corresponding row of storage cells in bank 1 memory array. In order to access a second row once a first row in the selected bank memory has been activated with the ACTIVE command, a bank memory array must be precharged with a PRECHARGE command or AUTO-PRECHARGE command before another ACTIVE command is applied to the bank memory array.

A valid READ command is initiated with the CS* and CAS* signals low, and the RAS* and WE* signals high on a rising edge of the CLK signal. The READ command from command controller 88 controls a column address latch 116 which receives address bits A0–A9 and holds a value representing a column address of the bank memory array selected by the BA signal at the time the READ command is initiated. Column address latch 116 latches the column address in response to a clock signal generated by a clock generator 118. Address pin A10 provides an input path for a command signal which determines whether or not an auto-precharge operation is to be initiated automatically after the read operation. The READ command provided from command controller 88 also initiates a burst read cycle, described in detail below, by starting a counter circuit 20A in shared counter 20 with a burst counting function. A multiplexer 20B of shared counter 20 receives the initial column address from column address latch 116 and provides the column address latch to counter circuit 20A.

An output circuit 20C of shared counter 20 provides the read burst counter output data from counter circuit 20A to a column address buffer 122 on an output line 20F. Column address buffer 122 provides the current count of the column address to a column decoder 124. Column decoder 124 activates four of the 1,024×4 lines, provided to sense amplifiers and input/output (I/0) gating circuit 126 and sense amplifiers and I/O gating circuit 128 corresponding to the current column address. Sense amplifiers and I/O gating circuits 126 and 128 operate in a manner known in the art to sense the data stored in the storage cells addressed by the active row decoder line and the active column decoder lines to provide the selected four bit byte of data from either bank 0 memory array or bank 1 memory array respectively to data-out buffer 92 during a read operation. Data-out buffer 92 provides the selected four bit byte of data to input/output data pins DQ1–DQ4.

In a burst read having a length of four, the initial column address stored in column address latch 116 is used to activate sense amplifiers and I/O gating circuits 126 or 128 during the first burst cycle of the burst read operation. Then, during the next three clock cycles counter circuit 20A of shared counter 20 counts up from the column address stored in column address latch 116, as defined by a sequence type, to "burst" or clock-out the next three memory locations of data. A full-page burst will wrap around and continually restart the "burst" operation until a BURST TERMINATION command or PRECHARGE command is indicated by command controller 88 or until interrupted with another burst operation.

A valid WRITE command is initiated with the CS*, CAS*, and WE* signals low and the RAS* signal high on the rising edge of the CLK signal. The WRITE command provided from command controller 88 controls clock generator 118 to clock column address latch 116 which receives and holds a value representing a column address of the bank memory array selected by the state of the BA signal at the time the WRITE command is initiated, as indicated by the address provided on address input pins A0–A9. As with the read operation, during the WRITE command, address pin A10 provides the additional feature to select whether or not the below described auto-precharge operation is to be initiated following the write operation.

The WRITE command provided from command controller 88 also initiates a burst write cycle by starting counter circuit 20A in shared counter 20 with the burst counting function described above for the burst read operation. Output circuit 20C of shared counter 20 provides the write burst counter output data from counter circuit 20A to column address buffer 122 on output line 20F. Column address buffer 122 provides the current column address to column decoder 124. Column decoder 124 activates four of the 1,024×4 lines to sense amplifiers and I/O gating circuits 126 and 128 corresponding to the column address to indicate where the incoming four bit byte of data is to be stored in either bank 0 memory array or bank 1 memory array.

During WRITE command operations data is provided on input/output pins DQ1–DQ4 to data-in buffer 90. Data in buffer 90 provides the input write data to a latch 130 corresponding to bank 0 memory array and a latch 132 corresponding to bank 1 memory array. The four bit byte of input write data is provided from latch 130 or 132 to the selected bank memory array with sense amplifiers and I/O gating circuits 126 or 128 in a manner known in the art based on the activated four lines corresponding to the current column address.

During a burst write operation of length four, the first byte of data is stored at the memory array location addressed by the column address stored in column address latch 116. Similar to the read burst operation, during the next three clock cycles, counter circuit 20A of shared counter 20 counts up from the column address stored in column latch 116, as defined by the sequence type, to "burst" or clock in the data to be stored in the next three memory locations. A full page burst will wrap around and continue writing data until terminated by the BURST TERMINATION command, PRECHARGE command, or until interrupted with another burst operation.

The burst read and write operation are controlled by the burst mode defined in mode register 100 which is programmable during the SET MODE REGISTER command. The burst operation provide for a continuous flow of data from or to the specified memory array location during read or write access. Burst lengths of 2, 4, 8, or full page (1,024) cycles are programmable into mode register 100 in one embodiment of SDRAM 80. In one embodiment, a burst read/single write mode permits a write operation to be a burst length of one and yet allows the read operation to be the programmmed burst length as defined in mode register 100.

In addition, a burst sequence is a programmable feature programmed into mode register 100 during the SET MODE REGISTER command. Typically two types of burst sequences are available for selection including a sequential sequence or an interleaving sequence. The sequential sequence bursts through sequential locations in the column being accessed in one of the two bank memory arrays. The interleaving sequence follows a set pattern which does not necessarily burst through sequential locations in the column being accessed. In one embodiment of SDRAM 80, both the sequential and interleaving sequences support bursts of 2, 4, and 8 cycles. In this one embodiment, the sequential sequence supports full page length burst cycles.

Command controller initiates a valid PRECHARGE command with the CS*, WE*, and the RAS* signals low and the CAS* signal high on the positive going edge of the CLK signal. The PRECHARGE command operation deactivates and precharges the bank memory array selected by the state of the BA signal at the time the PRECHARGE command is initiated. In this way, the row previously accessed is deactivated and precharged so that row may be refreshed or another row accessed. Once a bank memory array has been precharged, that bank memory array is in an idle state and must be activated prior to another READ command or WRITE command being issued to that bank memory array. In the preferred embodiment of the SDRAM 80, multiple READ and WRITE commands do not require precharging between each command provided the same row is being accessed.

Two refresh commands are typically available in SDRAM 80 which are an AUTO-REFRESH command and a SELF-REFRESH command. The AUTO-REFRESH command is performed with refresh controller 94 and shared counter 20. Shared counter 20 performs a refresh counter function with counter circuit 20A to refresh the memory arrays and stores refresh counter output data in its refresh counting function buffer 20D. The SELF-REFRESH command is performed with refresh controller 94, self-refresh oscillator 96, and shared counter 20. Shared counter 20 performs a self refresh timing function with counter circuit 20A. Self-refresh oscillator 96 provides an internally generated clock signal to a clock circuit 20E of shared counter 20. Clock circuit 20E provides the internally generated clock signal from self-refresh oscillator 96 to counter circuit 20A during self-refresh mode operations, and the normal counter clock signal to counter circuit 20A during other operations.

An AUTO REFRESH command is initiated by registering CS*, RAS* and CAS* low with WE* high. The AUTO REFRESH command is preferably employed while operating SDRAM 80. The AUTO REFRESH command is non-persistent, and therefore must be issued each time a refresh is required.

Addressing is generated by internal refresh controller 94 and shared counter 20 operating with the refresh counter function buffer 20D of the shared counter. Output circuit 20C of shared counter 20 provides the auto-refresh counter output data to row multiplexer 106 on an output line 20G. Thus, the A0–A10 address inputs are treated as "don't care" conditions during an AUTO REFRESH command. In one embodiment of the SDRAM 80 having 4,096 rows, all 4,096 rows need to be refreshed every 64 ms. Therefore, providing a distributed AUTO REFRESH command every 15.625 microseconds meets this refresh requirement and ensures that each row is refreshed. A non-preferred alternative form of refreshing is accomplished by issuing all 4,096 AUTO REFRESH commands in a burst at a minimum cycle rate every 64 ms.

When other non-auto refresh counting functions are performed, such as the burst counting function or the self-refresh timing function, the auto-refresh counter output data is stored in refresh counter function buffer 20D. Refresh counter function buffer 20D provides function buffer data to multiplexer 20B, which provides counter circuit 20A with the counter input data.

A SELF-REFRESH command is initiated by registering CKE, CS*, RAS*, and CAS* low with WE* high. Note that the command input signals are identical to an AUTO REFRESH command except that CKE is disabled. Once the SELF-REFRESH command is registered, all the inputs to SDRAM 80 become "don't cares" with the exception of CKE, as CKE must remain low.

Once SELF-REFRESH mode is engaged with the SELF-REFRESH command, SDRAM 80 provides its own internal clocking to cause it to perform its own AUTO REFRESH operations. The internal clocking is performed by self-refresh oscillator 96. The timing of when to perform an AUTO REFRESH command during self-refresh mode, is determined by operating counter circuit 20A of shared counter 20 as the self-refresh timer being effectively clocked by the clock signal generated from self-refresh oscillator 96. Output circuit 20C of shared counter 20 provides a self-refresh timing signal to refresh controller 94 on an output line 20H. In this way SDRAM 80 can remain in SELF-REFRESH mode for an indefinite period. Like during the AUTO REFRESH mode, the addressing during SELF-REFRESH mode is performed with refresh controller 94 and shared counter 20, and the refresh counter output data is held in its refresh counter function buffer 20D.

To exit SELF-REFRESH mode, the system clock must be stable prior to CKE going high. Once CKE transitions to high, SDRAM 80 must have NOP commands issued for an amount of time required for completion of any bank memory array being internally refreshed.

As illustrated in FIG. 2, the shared counter 20 according to the present invention performs at least three separate functions in SDRAM 80, which include the self refresh timing function, the auto refresh counting function, and the burst counting function in one shared counter. Although these known specific counting functions are shown and described for illustrative purposes, there are numerous other possible counting functions which may be performed by shared counter 20 in a memory integrated circuit according to the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A memory device, comprising:
    at least one memory array arranged in rows and columns;
    a shared counter, wherein the shared counter includes:
        a counter circuit for performing multiple counting functions on counter input data to provide counter output data, and an output circuit receiving the counter output data and providing the counter output data to one of K output lines, wherein K is at least two;
    a column address decoder receiving the counter output data on a first one of the K output lines from the shared counter to identify a column of the at least one memory array; and
    first circuitry receiving the counter output data on a second one of the K output lines from the shared counter.

2. The memory device of claim 1, wherein the first circuitry includes a row address decoder.

3. The memory device of claim 1, wherein the shared counter further includes:
    a first buffer adapted to receive the counter output data from the counter circuit and store first buffer data corresponding to counter output data provided as a result of a first counting function; and
    a multiplexer circuit coupled to receive a plurality of counter data sets including initialization data and the first buffer data, the multiplexer circuit providing a selected one of the plurality of counter data sets as the counter input data to the counter circuit.

4. The memory device of claim 3, wherein the memory device further includes a second buffer adapted to receive counter output data from the counter circuit and store second buffer data corresponding to counter output data provided as a result of a second counting function.

5. The memory device of claim 1, wherein the shared counter further includes an input selection circuit selecting one of M input data sets to be provided as counter input data.

6. The memory device of claim 1, wherein the device is a dynamic random access memory (DRAM).

7. The memory device of claim 1, wherein the device is a static random access memory (SRAM).

8. The memory device of claim 1, wherein the device is a video random access memory (VRAM).

9. The memory device of claim 1, wherein the device is a synchronous graphic random access memory (SGRAM).

10. The memory device of claim 1, wherein the shared counter performs a self-refresh timing function, an auto refresh counting function, and a burst counting function.

11. The memory device of claim 1, wherein the memory device further includes a clock circuit providing a first clock signal having a first clock frequency for use by the shared counter during a first of the multiple counting functions, and providing a second clock signal having a second clock frequency different than the first clock frequency for use by the shared counter during a second of the multiple counting functions.

12. A method of performing multiple counting functions in a shared counter, comprising:
  selecting a first initialization data;
  counting the first initialization data up or down using the shared counter to provide a first counter output data;
  storing the first counter output data set after performing the counting step corresponding to the first counting function;
  selecting a second initialization data;
  counting the second initialization data up or down using the shared counter to provide a second counter output data set;
  retrieving the first counter output data set; and
  counting the first counter output data set up or down using the shared counter to provide an updated first counter output data set.

13. The method of claim 12, wherein storing the first counter output data set includes storing the first counter output data set in a first buffer.

14. The method of claim 12, wherein the method further includes storing the second counter output data set in a second buffer corresponding to the second counting function.

15. The method of claim 14, wherein the method further includes retrieving the second counter output data set, from the second buffer.

16. The method of claim 14, wherein the method further includes retrieving the first counter output data set, from the first buffer.

17. The method of claim 14, wherein the method further includes using the second counter output data set to provide a memory address for use during a memory refresh operation.

18. The method of claim 14, wherein the method further includes using the first counter output data set to provide a memory address for use during a memory refresh operation.

19. The method of claim 14, wherein the method further includes:
  providing the first counter output data set to a first destination circuit at a first time;
  providing the second counter output data set to a second destination circuit at a second time; and
  providing the updated first counter output data set to the first destination circuit at a third time.

20. A method of performing multiple counting functions in a memory device, comprising:
  receiving address input data in a shared counter, wherein the shared counter includes a counter circuit and a number of buffer circuits; and
  performing multiple counting functions in the counter circuit in order to provide multiple outputs, wherein one output includes column address output data for accessing memory addresses in a memory array, and wherein another output includes buffer data to provide a memory address for use during a memory refresh operation.

21. The method of claim 20, wherein the method further includes routing the output data for use in accessing rows or columns of a first memory array at a first time and for use in accessing rows or columns of a second memory array at a second time.

22. The method of claim 20, wherein the method further includes routing first buffer data to a first buffer circuit in response to a first control signal and second buffer data to a second buffer circuit in response to a second control signal.

23. The method of claim 22, wherein receiving address input data includes receiving address input data from the first buffer circuit in response to a first control signal and from the second buffer circuit in response to a second control signal.

* * * * *